(12) United States Patent
Punzalan et al.

(10) Patent No.: US 7,274,089 B2
(45) Date of Patent: Sep. 25, 2007

(54) INTEGRATED CIRCUIT PACKAGE SYSTEM WITH ADHESIVE RESTRAINT

(75) Inventors: Jeffrey D. Punzalan, Singapore (SG); Il Kwon Shim, Singapore (SG); Zigmund Ramirez Camacho, Singapore (SG); Henry D. Bathan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 25 days.

(21) Appl. No.: 11/162,682

(22) Filed: Sep. 19, 2005

(65) Prior Publication Data

US 2007/0063320 A1    Mar. 22, 2007

(51) Int. Cl.
*H01L 23/495* (2006.01)

(52) U.S. Cl. .................. 257/676; 257/666; 257/670; 257/674; 257/E23.037; 257/E23.039

(58) Field of Classification Search ........ 257/666–677, 257/E23.031–E23.059, E23.004, E23.043–E23.05
See application file for complete search history.

(56) References Cited

U.S. PATENT DOCUMENTS

| | | | |
|---|---|---|---|
| 5,506,425 A | 4/1996 | Whtiney et al. | 257/177 |
| 6,166,430 A | 12/2000 | Yamaguchi | 257/666 |
| 6,433,424 B1 | 8/2002 | Sammon | 257/735 |
| 6,870,245 B1 | 3/2005 | Schatzler et al. | 257/669 |
| 2002/0031869 A1* | 3/2002 | Minamio et al. | 438/127 |
| 2002/0121680 A1* | 9/2002 | Ahn et al. | 257/666 |
| 2002/0195703 A1* | 12/2002 | Kameda | 257/710 |
| 2003/0001244 A1* | 1/2003 | Araki et al. | 257/666 |
| 2003/0001260 A1* | 1/2003 | Azuma | 257/731 |
| 2004/0056337 A1* | 3/2004 | Hasebe et al. | 257/667 |

* cited by examiner

*Primary Examiner*—Jasmine Clark
(74) *Attorney, Agent, or Firm*—Mikio Ishimaru

(57) ABSTRACT

An integrated circuit package system including an integrated circuit die and a lead frame with a trenched die pad. The integrated circuit die is mounted to the trenched die pad.

20 Claims, 2 Drawing Sheets

INTEGRATED CIRCUIT PACKAGE SYSTEM WITH ADHESIVE RESTRAINT

TECHNICAL FIELD

The present invention relates generally to integrated circuit package systems, and more particularly to a system for an integrated circuit package with adhesive restraint.

BACKGROUND ART

An integrated circuit die is a small device formed on a silicon wafer, such as a semiconductor wafer. Such an integrated circuit die is typically cut from the wafer and attached to a substrate or base carrier for redistribution of interconnects. Bond pads on the integrated circuit die are then electrically connected to the leads on the carrier via wire bonding. The integrated circuit die and wire bonds are encapsulated with a protective material such that a package is formed. The leads encapsulated in the package are redistributed in a network of conductors within the carrier and end in an array of terminal points outside the package. The terminal points allow the integrated circuit die to be electrically connected with other circuits, such as on a printed circuit board. An integrated circuit can also be attached to another integrated circuit to form a stacked multi-chip device.

Modern consumer electronics particularly personal portable devices, such as cell phones, digital cameras, music players, PDA's, and location-based devices, require miniaturization as well as increasing integrated circuit die content to fit an ever shrinking physical space. Numerous technologies have been developed to meet these requirements. Some of these technologies involve larger integrated circuit die in smaller integrated circuit packages.

The demand for leadless packages for large integrated circuit die applications is increasing due to the migration of mature packages to leadless and small form factor packages. These technologies have struggled with manufacturing and fabrication problems including the attachment of the integrated circuit die and the related adhesives. Other problems include stresses often resulting in damage to the integrated circuit die, such as delamination, adhesive bleed out and spread out. This damage causes failures that are sometimes intermittent and hard to detect or analyze. Broad use of integrated circuit die has extended the needs for reliability and performance beyond even recent expectations.

Thus a need still remains for an integrated circuit package system to ensure that the manufacturing methods provide increasing reliability and performance. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including an integrated circuit die and a lead frame with a trenched die pad. The integrated circuit die is mounted to the trenched die pad.

Certain embodiments of the invention have other advantages in addition to or in place of those mentioned or obvious from the above. The advantages will become apparent to those skilled in the art from a reading of the following detailed description when taken with reference to the accompanying drawings.

BEST MODE FOR CARRYING OUT THE INVENTION

Figure 1:
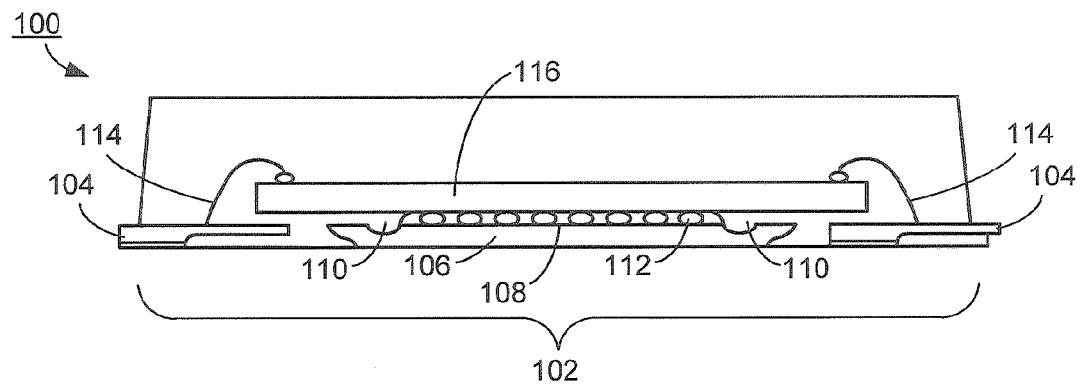
FIG. 1 is a cross-sectional view of an integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known circuits, package configurations, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGS. Similarly, although the sectional views in the drawings for ease of description show the integrated circuit die with mounted surfaces as oriented in a particular direction, this arrangement in the FIGS. is arbitrary and is not intended to suggest that the integrated circuit die should necessarily be attached in any direction. Generally, the device can be operated in any orientation. The same numbers are used in all the drawing FIGS. to relate to the same elements.

The term "horizontal" as used herein is defined as a plane parallel to the conventional plane or surface of the lead frame, regardless of its orientation. The term "vertical" refers to a direction perpendicular to the horizontal as just defined. Terms, such as "on", "above", "below", "bottom", "top", "side" (as in "sidewall"), "higher", "lower","over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit package system 100 in an embodiment of the present invention. The integrated circuit package system 100 includes a lead frame 102 having leads 104 in a dual row configuration and a trenched die pad 106. The trenched die pad 106 includes an adhesive plane 108 and an adhesive trench 110. For illustrative purposes the adhesive plane 108 and the leads 104 are shown in the same horizontal plane, although it is understood that the adhesive plane 108 and the leads 104 may be in different horizontal planes, as well. Further, it is understood that the leads 104 may have other configurations, as well.

The adhesive trench 110 may be formed by an etch process that removes material of the trenched die pad 106. Removing the material of the trenched die pad 106 forms the adhesive trench 110 and also forms the adhesive plane 108. For illustrative purposes the adhesive trench 110 is shown as a channel-like formation surrounding the adhesive plane 108 and within an outer dimension of the trenched die pad 106, although it is understood that the adhesive trench 110 may be a different shape and dimension, as well. Further, it is understood that the adhesive trench 110 need not surround the adhesive plane 108, as well.

The adhesive trench 110 provides an adhesive boundary, barrier or stopping point for the flow of an adhesive 112, wherein the adhesive 112 size and shape may be restrained. The adhesive 112 may be conductive, non-conductive or with fillers made of silver or silicone, as well. The adhesive plane 108 further provides a specific surface area for the adhesive 112. For illustrative purposes the adhesive 112 is shown as a compound, although it is understood that the adhesive 112 may be a homogenous material, as well. Further, it is understood that the adhesive 112 may be a tape or any other attachment material, method or process, as well.

Electrical interconnects 114 provide electrical connection of an integrated circuit die 116 to the leads 104. For illustrative purposes the integrated circuit die 116 is shown electrically connected to the lead frame 102 using wire bonding, although it is understood that any other electrical connection material, method or process may be used, as well. Further, it is understood that any number of electrical interconnects may be used, as well.

Figure 2:
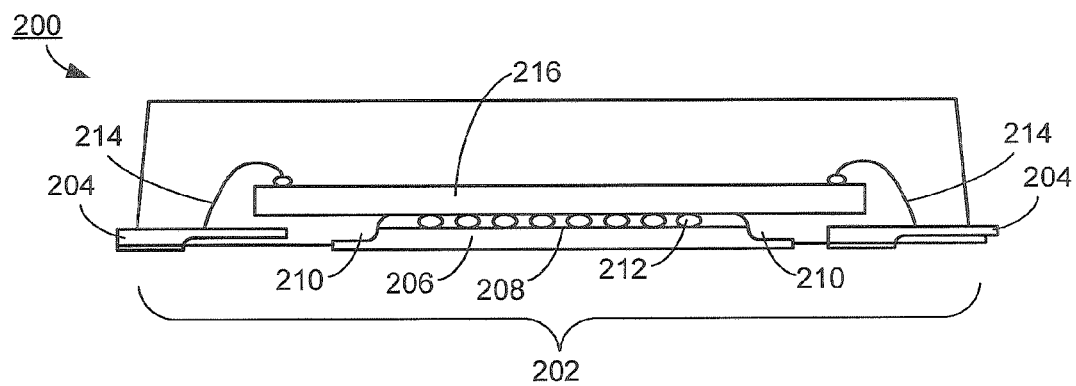
FIG. 2 is a cross-sectional view of an integrated circuit package system in an alternate embodiment of the present invention.

Referring now to FIG. 2, therein is shown a cross-sectional view of an integrated circuit package system 200 in an alternate embodiment of the present invention. In a similar manner to the FIG. 1 embodiment, the integrated circuit package system 200 includes a lead frame 202 having leads 204 in a dual row configuration and a trenched die pad 206. The trenched die pad 206 includes an adhesive plane 208 and an adhesive trench 210. For illustrative purposes the adhesive plane 208 and the leads 204 are shown in the same horizontal plane, although it is understood that the adhesive plane 208 and the leads 204 may be in different horizontal planes, as well. Further, it is understood that the leads 204 may have other configurations, as well.

The adhesive trench 210 may be formed by an etch process that removes material of the trenched die pad 206. Removing the material of the trenched die pad 206 forms the adhesive trench 210 and also forms the adhesive plane 208. The trenched die pad 206 has the adhesive trench 210 with a channel-like formation, open to the outside, surrounding the adhesive plane 208 and at an outer dimension of the trenched die pad 206, although it is understood that the adhesive trench 210 may be a different shape and dimension, as well. Further, it is understood that the adhesive trench 210 need not surround the adhesive plane 208, as well.

The adhesive trench 210 provides an adhesive boundary, barrier or stopping point for the flow of an adhesive 212, wherein the adhesive 212 size and shape may be restrained. The adhesive 212 may be conductive, non-conductive or with fillers made of silver or silicone, as well. The adhesive plane 208 further provides a specific surface area for the adhesive 212. For illustrative purposes the adhesive 212 is shown as a compound, although it is understood that the adhesive 212 may be a homogenous material, as well. Further, it is understood that the adhesive 212 may be a tape or any other attachment material, method or process, as well.

Electrical interconnects 214 provide electrical connection of an integrated circuit die 216 to the leads 204. The integrated circuit die 216 is larger than the trenched die pad 206 and overhanging edges of the trenched die pad 206 and the leads 204. For illustrative purposes the integrated circuit die 216 is shown electrically connected to the lead frame 202 using wire bonding, although it is understood that any other electrical connection material, method or process may be used, as well. Further, it is understood that any number of electrical interconnects may be used, as well.

Figure 3:
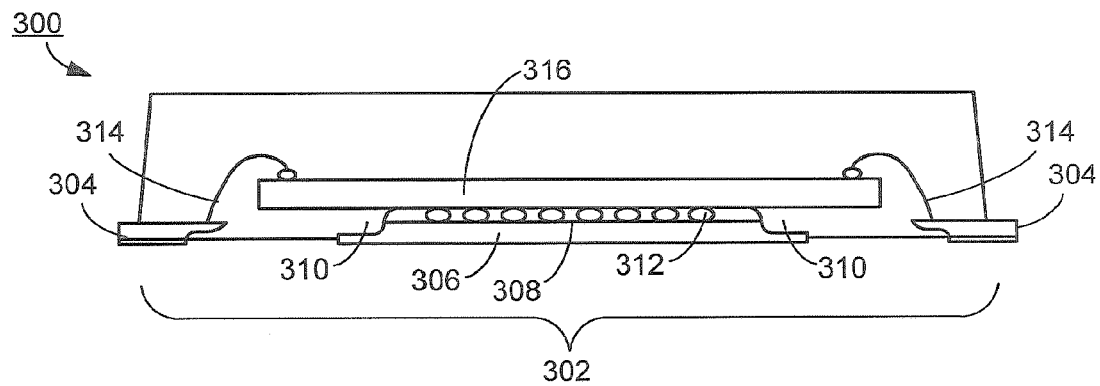
FIG. 3 is a cross-sectional view of an integrated circuit package system in yet another embodiment of the present invention.

Referring now to FIG. 3, therein is shown a cross-sectional view of an integrated circuit package system 300 in yet another embodiment of the present invention. In a similar manner to the FIG. 2 embodiment, the integrated circuit package system 300 includes a lead frame 302 having leads 304 in a single row configuration and a trenched die pad 306. The trenched die pad 306 includes an adhesive plane 308 and an adhesive trench 310. For illustrative purposes the adhesive plane 308 and the leads 304 are shown in the same horizontal plane, although it is understood that the adhesive plane 308 and the leads 304 may be in different horizontal planes, as well. Further, it is understood that the leads 304 may have other configurations, as well.

The adhesive trench 310 may be formed by an etch process that removes material of the trenched die pad 306. Removing the material of the trenched die pad 306 forms the adhesive trench 310 and also forms the adhesive plane 308. For illustrative purposes the adhesive trench 310 is shown as a channel-like formation surrounding the adhesive plane 308 and at an outer dimension of the trenched die pad 306, although it is understood that the adhesive trench 310 may be a different shape and dimension, as well. Further, it is understood that the adhesive trench 310 need not surround the adhesive plane 308, as well.

The adhesive trench 310 provides an adhesive boundary, barrier or stopping point for the flow of an adhesive 312, wherein the adhesive 312 size and shape may be restrained. The adhesive 312 may be conductive, non-conductive or with fillers made of silver or silicone, as well. The adhesive plane 308 further provides a specific surface area for the adhesive 312. For illustrative purposes the adhesive 312 is shown as a compound, although it is understood that the adhesive 312 may be a homogenous material, as well. Further, it is understood that the adhesive 312 may be a tape or any other attachment material, method or process, as well.

Electrical interconnects 314 provide electrical connection of an integrated circuit die 316 to the leads 304. For illustrative purposes the integrated circuit die 316 is shown electrically connected to the lead frame 302 using wire bonding, although it is understood that any other electrical connection material, method or process may be used, as well. Further, it is understood that any number of electrical interconnects may be used, as well.

Figure 4:
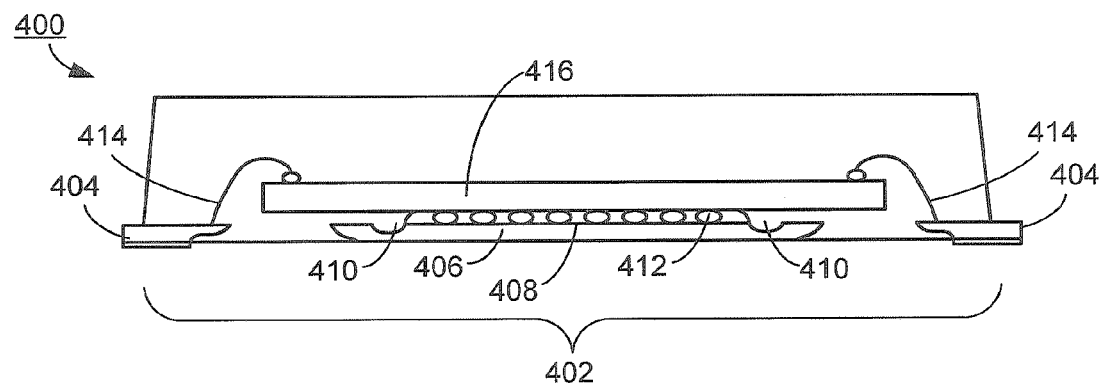
FIG. 4 is a cross-sectional view of an integrated circuit package system in yet another embodiment of the present invention.

Referring now to FIG. 4, therein is shown a cross-sectional view of an integrated circuit package system 400 in yet another embodiment of the present invention. In a similar manner to the FIG. 3 embodiment, the integrated circuit package system 400 includes a lead frame 402 having leads 404 in a single row configuration and a trenched die pad 406. The trenched die pad 406 includes an adhesive plane 408 and an adhesive trench 410. For illustrative purposes the adhesive plane 408 and the leads 404 are shown in the same horizontal plane, although it is understood that the adhesive plane 408 and the leads 404 may be in different horizontal planes, as well. Further, it is understood that the leads 404 may have other configurations, as well.

The adhesive trench 410 may be formed by an etch process that removes material of the trenched die pad 406. Removing the material of the trenched die pad 406 forms the adhesive trench 410 and also forms the adhesive plane 408. For illustrative purposes the adhesive trench 410 is shown as a channel-like formation surrounding the adhesive plane 408 and within an outer dimension of the trenched die pad 406, although it is understood that the adhesive trench 410 may be a different shape and dimension, as well. Further, it is understood that the adhesive trench 410 need not surround the adhesive plane 408, as well.

The adhesive trench 410 provides an adhesive boundary, barrier or stopping point for the flow of an adhesive 412, wherein the adhesive 412 size and shape may be restrained. The adhesive 412 may be conductive, non-conductive or with fillers made of silver or silicone, as well. The adhesive plane 408 further provides a specific surface area for the adhesive 412. For illustrative purposes the adhesive 412 is shown as a compound, although it is understood that the adhesive 412 may be a homogenous material, as well. Further, it is understood that the adhesive 412 may be a tape or any other attachment material, method or process, as well.

Electrical interconnects 414 provide electrical connection of an integrated circuit die 416 to the leads 404. For illustrative purposes the integrated circuit die 416 is shown electrically connected to the lead frame 402 using wire bonding, although it is understood that any other electrical connection material, method or process may be used, as well. Further, it is understood that any number of electrical interconnects may be used, as well.

Figure 5:
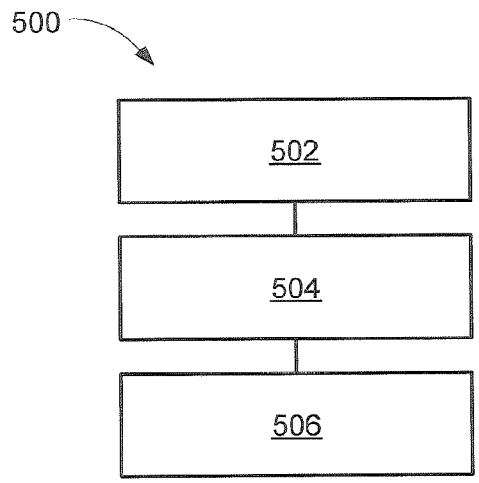
FIG. 5 is a flow chart of a system for an integrated circuit package in an embodiment of the present invention.

Referring now to FIG. 5, therein is shown a flow chart of a system 500 for an integrated circuit package in an embodiment of the present invention. The system 500 includes providing an integrated circuit die in a block 502; forming a lead frame having a trenched die pad with an adhesive trench in a block 504; and mounting the integrated circuit die to the trenched die pad with an adhesive trench in a block 506.

In greater detail, a method to fabricate the integrated circuit package system 100, according to an embodiment of the present invention, is performed as follows:

(1) 1. The integrated circuit die 116 is an ultra-large-scale integrated circuit with a large planar dimension. (FIG. 1)

(2) 2. The lead frame 102 having the leads 104 and the trenched die pad 106, is formed by an etching or stamping process. (FIG. 1)

(3) 3. The adhesive trench 110 and the adhesive plane 108 are formed by etching the trenched die pad 106. (FIG. 1)

(4) 4. The integrated circuit die 116 mounts to the adhesive plane 108 by applying the adhesive 112. (FIG. 1)

It has been discovered that the present invention thus has numerous advantages.

An advantage is that the present invention improves the integrated circuit package reliability and performance. Significant improvements in the fabrication methods, manufacturing processes and product yield result from several advantages of the present invention. Improving the reliability and performance results in a reduction of manufacturing scrap and more importantly a reduction in failures after integration into higher-level systems, particularly those released and in the field.

It has been discovered that the disclosed structure provides improved adhesive size and shape between the lead frame and integrated circuit die. The improved size and shape of the adhesive is a result of the adhesive trench controlling the spread out of the adhesive. This improved size and shape provides an improved adhesive layer between the lead frame and the integrated circuit die. This is particularly beneficial to large integrated circuit die dimensions that can exhibit forces across the adhesive layer during manufacturing and fabrication of the integrated circuit package.

It has also been discovered that the disclosed structure improves the adhesive boundaries. The adhesive plane bounds the spread of the adhesive resulting in a larger amount of adhesive in a smaller area. The integrated circuit packages with smaller form factors require a higher adhesion per area to accommodate the packaging of large integrated circuit die dimensions.

Yet another discovery of the disclosed structure is the improvement in the reduction of delamination. Large die are particularly susceptible to delamination. The improved adhesive boundaries and the improved size and shape of the adhesive reduce the bleed out of the adhesive often resulting in lead frame and integrated circuit die delamination.

Yet another discovery of the disclosed structure is a wider range of allowable integrated circuit die sizes. Much larger integrated circuit die dimensions can be accommodated with this structure. The reduced sensitivity to the differences between integrated circuit die size and the lead frame size eliminates many size restrictions as well as manufacturing and fabrication problems.

These and other valuable aspects of the present invention consequently further the state of the technology to at least the next level.

Thus, it has been discovered that the integrated circuit package system method and apparatus of the present invention furnish important and heretofore unknown and unavailable solutions, capabilities, and functional advantages for integrated circuit packages. The resulting processes and configurations are straightforward, cost-effective, uncomplicated, highly versatile and effective, can be implemented by adapting known technologies, and are thus readily suited for efficiently and economically manufacturing integrated circuit package devices. The resulting processes and configurations are straightforward, cost-effective, uncomplicated, highly versatile, accurate, sensitive, and effective, and can be implemented by adapting known components for ready, efficient, and economical manufacturing, application, and utilization.

The resulting processes and configurations are straightforward, cost-effective, uncomplicated, highly versatile and effective, can be implemented by adapting known technologies, and are thus readily suited for efficiently and economically manufacturing large die integrated circuit packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit package system comprising:
   providing an integrated circuit die;
   forming a lead frame, the lead frame having a trenched die pad to restrain adhesive propagation, the trenched die pad having an adhesive trench with a channel-like formation, open to the outside; and
   mounting the integrated circuit die to overhang edges of the trenched die pad.

2. The system as claimed in claim 1 wherein forming the lead frame having the trenched die pad comprises forming an adhesive plane.

3. The system as claimed in claim 1 wherein forming the lead frame comprises etching or machine stamping.

4. The system as claimed in claim 1 wherein mounting the integrated circuit die to the trenched die pad comprises applying an adhesive whereon the integrated circuit die and the trenched die pad are bonded.

5. The system as claimed in claim 1 further comprising electrically connecting the integrated circuit die to leads of the lead frame having the trenched die pad.

6. An integrated circuit package system comprising: providing an integrated circuit die; forming a lead frame, the lead frame having leads and a trenched die pad with an
    adhesive trench and an adhesive plane to restrain adhesive propagation, the trenched die pad having an adhesive trench with a channel-like formation, open to the outside; and mounting the integrated circuit die to the adhesive plane with the integrated
    circuit die overhanging edges of the trenched die pad and the leads.

7. The system as claimed in claim 6 wherein forming the lead frame comprises forming leads in a dual row configuration and forming the adhesive trench within an outer dimension of the trenched die pad.

8. The system as claimed in claim 6 wherein forming the lead frame comprises forming leads in a dual row configuration and forming the adhesive trench at an outer dimension of the trenched die pad.

9. The system as claimed in claim 6 wherein forming the lead frame comprises forming leads in a single row configuration and forming the adhesive trench at the outer dimension of the trenched die pad.

10. The system as claimed in claim 6 wherein forming the lead frame comprises forming leads in a single row configuration and forming the adhesive trench within the outer dimension of the trenched die pad.

11. An integrated circuit package system comprising:
    an integrated circuit die; and
    a trenched die pad to restrain adhesive propagation, the trenched die pad having an adhesive trench with a channel-like formation, open to the outside wherein the integrated circuit die is mounted to the trenched die pad to extend over the trenched die pad.

12. The system as claimed in claim 11 wherein the lead frame having the trenched die pad comprises an adhesive plane.

13. The system as claimed in claim 11 wherein the lead frame having the trenched die pad comprises processes such as etching or machine stamping.

14. The system as claimed in claim 11 wherein the integrated circuit die mounted to the trenched die pad comprises an adhesive applied to the integrated circuit die attached to the trenched die pad.

15. The system as claimed in claim 11 further comprising the integrated circuit die electrically connected to leads of the lead frame.

16. An integrated circuit package system comprising:
    an integrated circuit die;
    a trenched die pad with an adhesive trench and an adhesive plane to restrain adhesive propagation, the trenched die pad having an adhesive trench with a channel-like formation, open to the outside; and
    leads adjacent the trenched die pad wherein the integrated circuit die is mounted to the adhesive plane with the integrated circuit die overhanging edges of the trenched die pad and the leads.

17. The system as claimed in claim 16 wherein the lead frame comprises leads in a dual row configuration and the adhesive trench within an outer dimension of the trenched die pad.

18. The system as claimed in claim 16 wherein the lead frame comprises leads in the dual row configuration and the adhesive trench at the outer dimension of the trenched die pad.

19. The system as claimed in claim 16 wherein the lead frame comprises leads in a single row configuration and the adhesive trench at the outer dimension of the trenched die pad.

20. The system as claimed in claim 16 wherein the lead frame comprises leads in a single row configuration and the adhesive trench within the outer dimension of the trenched die pad.

* * * * *